(12) United States Patent
Jeng et al.

(10) Patent No.: US 9,190,325 B2
(45) Date of Patent: *Nov. 17, 2015

(54) TSV FORMATION

(71) Applicant: Taiwan Semiconductor Manufacturing Company, Ltd., Hsin-Chu (TW)

(72) Inventors: Shin-Puu Jeng, Hsin-Chu (TW); Wen-Chih Chiou, Zhunan Township (TW); Ku-Feng Yang, Dali (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/144,775

(22) Filed: Dec. 31, 2013

(65) Prior Publication Data

US 2014/0110862 A1   Apr. 24, 2014

Related U.S. Application Data (63) Continuation-in-part of application No. 14/018,210, filed on Sep. 4, 2013, now Pat. No. 8,836,085, which is a continuation of application No. 12/895,296, filed on Sep. 30, 2010, now Pat. No. 8,580,682.

(51) Int. Cl.
| | |
|---|---|
| *H01L 21/768* | (2006.01) |
| *H01L 23/522* | (2006.01) |
| *H01L 23/48* | (2006.01) |
| *H01L 23/532* | (2006.01) |
| *H01L 23/00* | (2006.01) |

(52) U.S. Cl.
CPC ........ *H01L 21/76898* (2013.01); *H01L 23/481* (2013.01); *H01L 23/53238* (2013.01); *H01L 21/76838* (2013.01); *H01L 21/76897* (2013.01); *H01L 24/03* (2013.01); *H01L 24/05* (2013.01); *H01L 2224/0401* (2013.01); *H01L 2224/05009* (2013.01); *H01L 2224/05025* (2013.01); *H01L 2224/131* (2013.01); *H01L 2224/13025* (2013.01); *H01L 2924/00013* (2013.01)

(58) Field of Classification Search
CPC ............... H01L 21/76897; H01L 21/76838; H01L 23/5226
USPC .................... 257/774, 621; 438/667
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,004,619 A | 12/1999 | Dippon et al. |
| 6,184,060 B1 | 2/2001 | Siniaguine |
| 6,322,903 B1 | 11/2001 | Siniaguine et al. |

(Continued)

*Primary Examiner* — Peniel M Gumedzoe
(74) *Attorney, Agent, or Firm* — Slater & Matsil, L.L.P.

(57) ABSTRACT

A device includes a substrate having a front side and a backside, the backside being opposite the front side. An isolation layer is disposed on the front side of the substrate, wherein first portions of isolation layer and the substrate are in physical contact. A through substrate via (TSV) extends from the front side to the backside of the substrate. An oxide liner is on a sidewall of the TSV. The oxide liner extends between second portions of the substrate and the isolation layer. A dielectric layer having a metal pad is disposed over the isolation layer on the front side of the substrate. The metal pad and the TSV are formed of a same material.

20 Claims, 10 Drawing Sheets

(56) References Cited

U.S. PATENT DOCUMENTS

| | | |
|---|---|---|
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 8,580,682 B2 | 11/2013 | Yang et al. |
| 2003/0077897 A1 | 4/2003 | Tsai et al. |
| 2006/0108691 A1 | 5/2006 | Kameyama et al. |
| 2006/0216921 A1 | 9/2006 | Kato |
| 2006/0240187 A1* | 10/2006 | Weidman .................. 427/248.1 |
| 2006/0251800 A1* | 11/2006 | Weidman et al. ............ 427/99.5 |
| 2007/0018320 A1 | 1/2007 | Tanida et al. |
| 2007/0178694 A1 | 8/2007 | Hiatt |
| 2009/0051039 A1* | 2/2009 | Kuo et al. ..................... 257/774 |
| 2009/0130846 A1 | 5/2009 | Mistuhashi |
| 2009/0206488 A1 | 8/2009 | Lindgren et al. |
| 2009/0278237 A1 | 11/2009 | Cooney, III et al. |
| 2009/0280643 A1 | 11/2009 | Andry et al. |
| 2010/0244247 A1 | 9/2010 | Chang et al. |
| 2011/0073997 A1 | 3/2011 | Leuschner et al. |

* cited by examiner

TSV FORMATION

CROSS-REFERENCE TO RELATED APPLICATIONS

This application is a continuation-in-part of U.S. patent application Ser. No. 14/018,210, filed Sep. 4, 2013 entitled "Cost-Effective TSV Formation", which is a continuation application of Ser. No. 12/895,296, filed Sep. 30, 2010, entitled "Cost-Effective TSV Formation", which applications are hereby incorporated herein by reference.

BACKGROUND

Through-substrate vias (TSVs) are commonly used in three-dimensional (3D) integrated circuits. TSVs penetrate through substrates, and are used to electrically inter-couple features on opposite sides of the substrates.

Conventionally, the TSV formation process includes etching or drilling into the substrate to form TSV openings. The TSV openings are then filled with a conductive material, which is then planarized to remove excess portions, and the remaining portions of the conductive material in the substrate form the TSVs. Additional metal lines and/or metal pads are then formed over and electrically coupled to the TSVs, for example, using damascene processes.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 10B are cross-sectional views of intermediate stages in the manufacturing of a through-substrate via (TSV) in accordance with various embodiments;

FIGS. 11 through 15B are cross-sectional views of intermediate stages in the manufacturing of a TSV in accordance with alternative embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A through-substrate via (TSV) and the method of forming the same are provided in accordance with an embodiment. The intermediate stages of manufacturing an embodiment are illustrated. The variations of the embodiments are then discussed. Throughout the various views and illustrative embodiments, like reference numbers are used to designate like elements.

Figure 1:
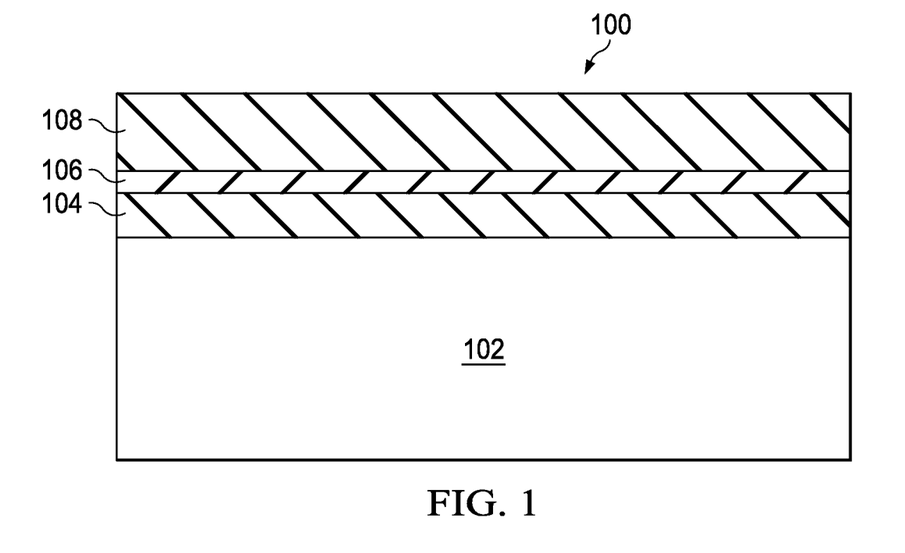

Referring to FIG. 1, a cross-sectional view of a portion of wafer 100 is provided. Wafer 100 includes a substrate 102. The illustrated structure may be a portion of a chip/die in wafer 100, which may include a plurality of chips identical to the illustrated chip. Substrate 102 may be a bulk substrate formed of a semiconductor material, such as silicon, silicon germanium, silicon carbide, gallium arsenide, or other commonly used semiconductor materials. Alternatively, substrate 102 may be a silicon on insulator (SOI) substrate or include dielectric materials such as silicon oxide. Wafer 100 may include active devices such as transistors (not shown). Accordingly, wafer 100 may be a device wafer, and the respective chips/dies therein are device chips/dies. Alternatively, wafer 100 is free from active devices, and may include, or may be free from, passive devices such as capacitors, resistors, inductors, varactors, and/or the like (not shown). Accordingly, wafer 100 may be an interposer wafer comprising interposers or a wafer comprising package substrates.

An isolation layer 104 is formed over a front side of substrate 102. In an embodiment, substrate 102 is a semiconductor substrate, and isolation layer may comprise an oxide formed through thermal oxidation of substrate 102. Alternatively, isolation layer 104 may be formed using a deposition method, and may comprise silicon oxide, silicon nitride, or the like. In the embodiments in which the active devices (not shown) are formed at the front side of substrate 102, isolation layer 104 may include an inter-layer dielectric (in which contact plugs (not shown) connected to the gate, source and drain regions of transistors are formed).

An etch stop layer 106 (ESL) may be formed over isolation layer 104, and a dielectric layer 108 may be formed on ESL 106. ESL 106 may be a silicon nitride layer, a silicon carbide layer, or the like. The materials of dielectric layer 108 may include silicon oxide, a spin-on dielectric (SOD) material, polyimide, and/or the like. Alternatively, dielectric layer 108 is formed of a low-k dielectric material have a k value lower than about 3.0, or lower than about 2.5, for example. The thickness of dielectric layer 108 may be greater than the thickness of isolation layer 104. Dielectric layer 108 may further include an anti-reflection coating layer (ARC, such as a silicon oxynitride layer, not shown).

Figure 2:
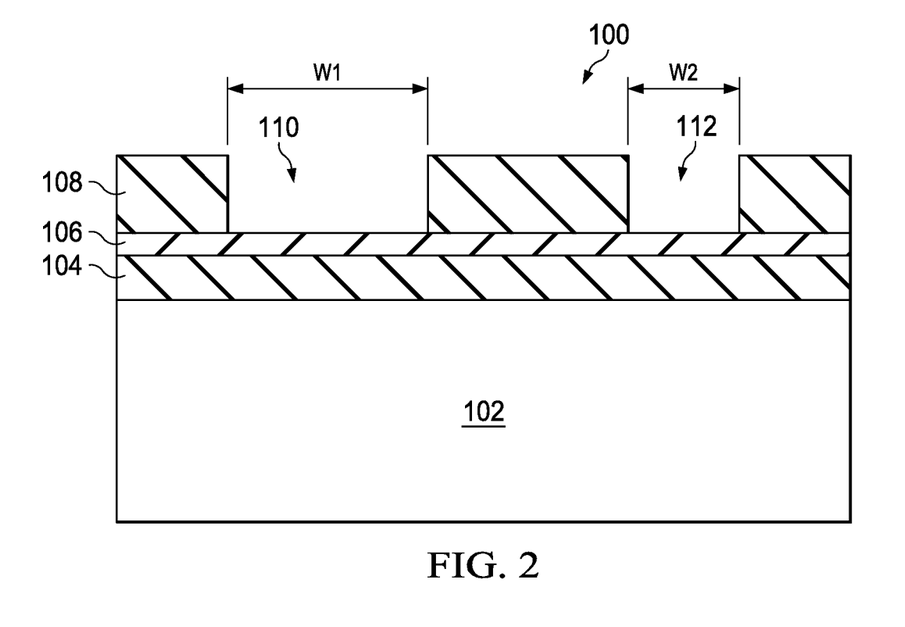

Referring to FIG. 2, dielectric layer 108 may be patterned to form pad opening 110 and trench 112. Dielectric layer 108 may be patterned using, for example, a combination of photolithography and etching. During the etching step, ESL 106 may prevent the patterning of isolation layer 104 and substrate 102. Generally, the features of wafer 100 may not be drawn to scale. For example, in advanced finally-pitched semiconductor devices/manufacturing processes, horizontal dimension W1 of pad opening 110 may be equal to or greater than about 12 μm whereas horizontal dimension W2 of trench 112 may be less than about 0.6 μm. Other embodiments may include other values for horizontal dimensions W1 and W2. Although only one trench 112 is illustrated in FIG. 2, dielectric layer 108 may be patterned to include any number of trenches. Horizontal dimensions W1 and W2 may be a diameter or a length/width, depending on the top-view shapes of pad opening 110 and trench 112, respectively.

Figure 3:
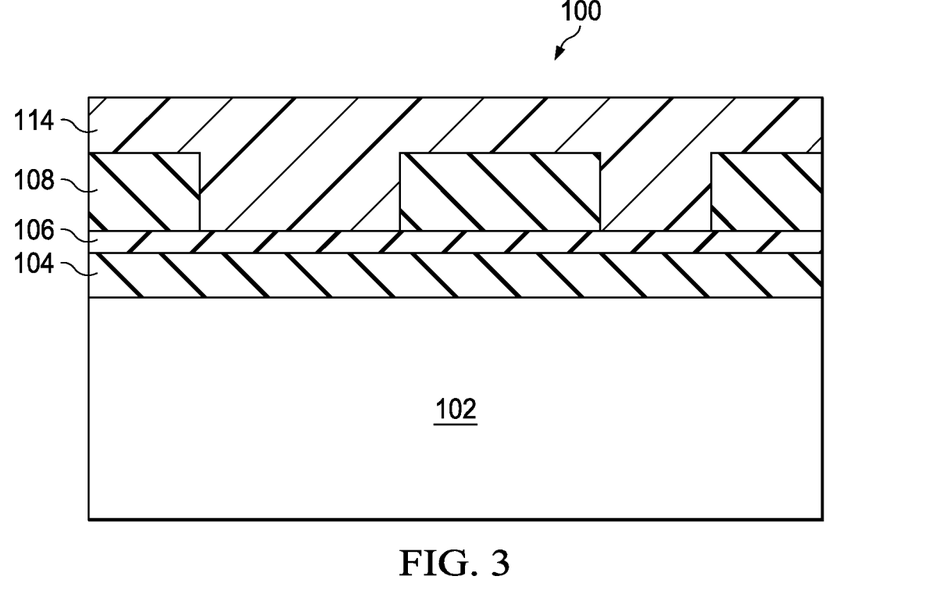

Referring to FIG. 3, a photoresist 114 is deposited over dielectric layer 108. Photoresist 114 may be deposited, for example, using a spin on coating technique. The deposition of photoresist 114 may flow into and fill pad opening 110 and trench 112 in dielectric layer 108.

Figure 4:
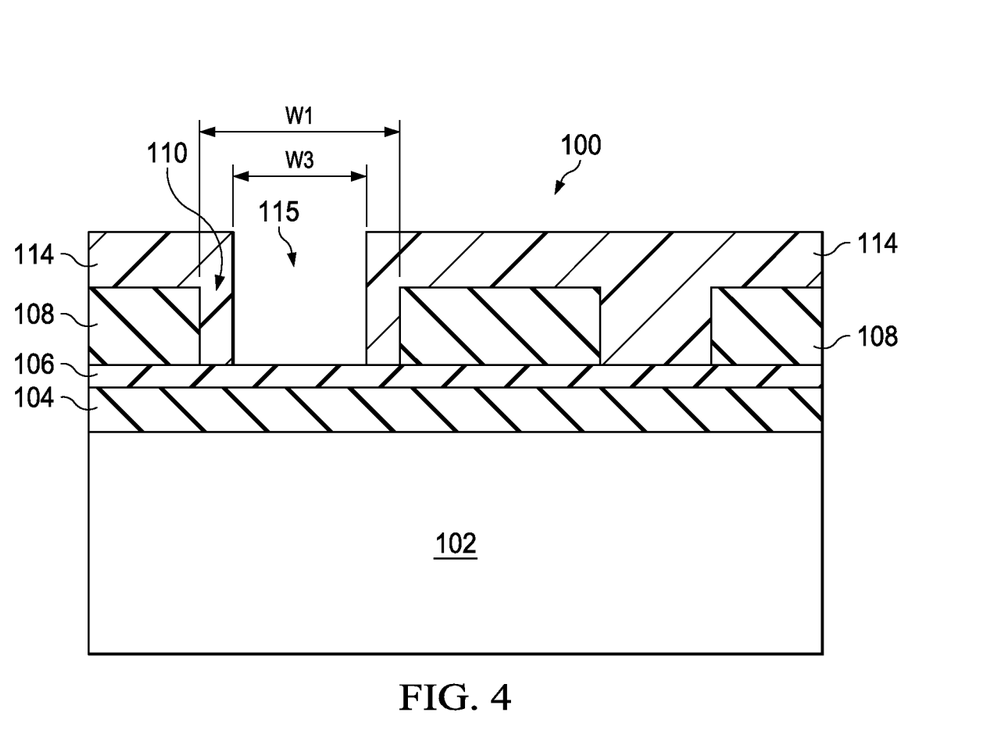

Next, referring to FIG. 4, photoresist 114 is patterned to form an opening 115 in photoresist 114. Photoresist 114 may be patterned using a photo mask and exposing portions of photoresist 114 (e.g., by applying ultraviolet light). The exposed or unexposed portion of photoresist 114 may then be removed depending on whether a positive or negative resist was used. Opening 115 may be positioned within pad opening 110 in dielectric layer 108. In various embodiments, opening 115 has a horizontal dimension W3 that is equal to or greater than about 12 μm. In other embodiments, horizontal dimension W3 may be smaller than about 12 μm. However, horizontal dimension W3 of opening 115 may be less than horizontal dimension W1 of pad opening 110.

Figure 5:
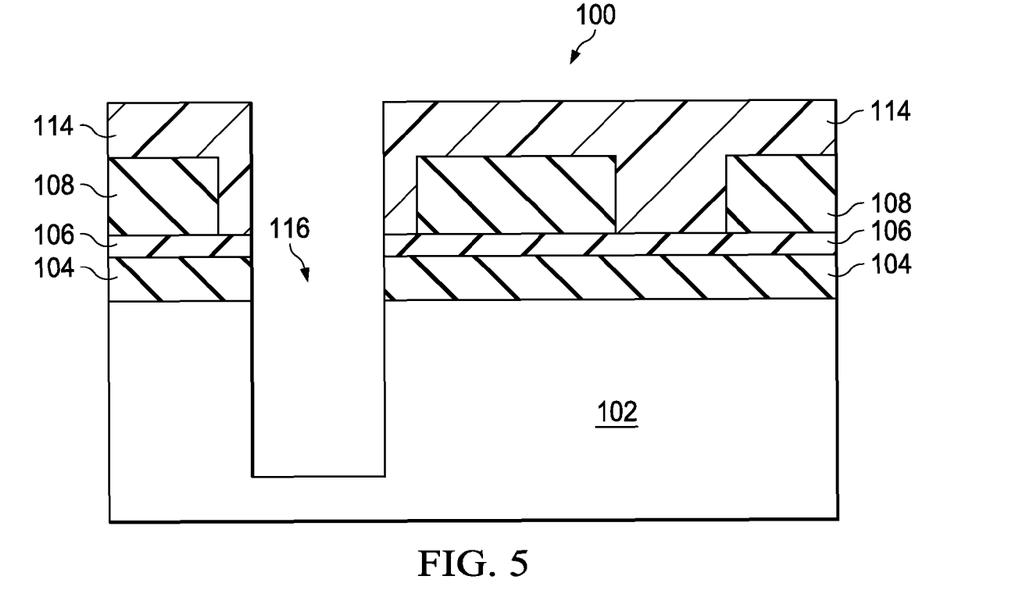

Next, as shown in FIG. 5, photoresist 114 is used as a mask to etch ESL 106, isolation layer 104, and substrate 102. As a result of the etching step, a through substrate via (TSV, sometimes referred to as a through silicon via or a through via) opening 116 is formed in substrate 105. Photoresist 114 is then removed, for example, through an ashing process as illustrated by FIG. 6.

Figure 6:
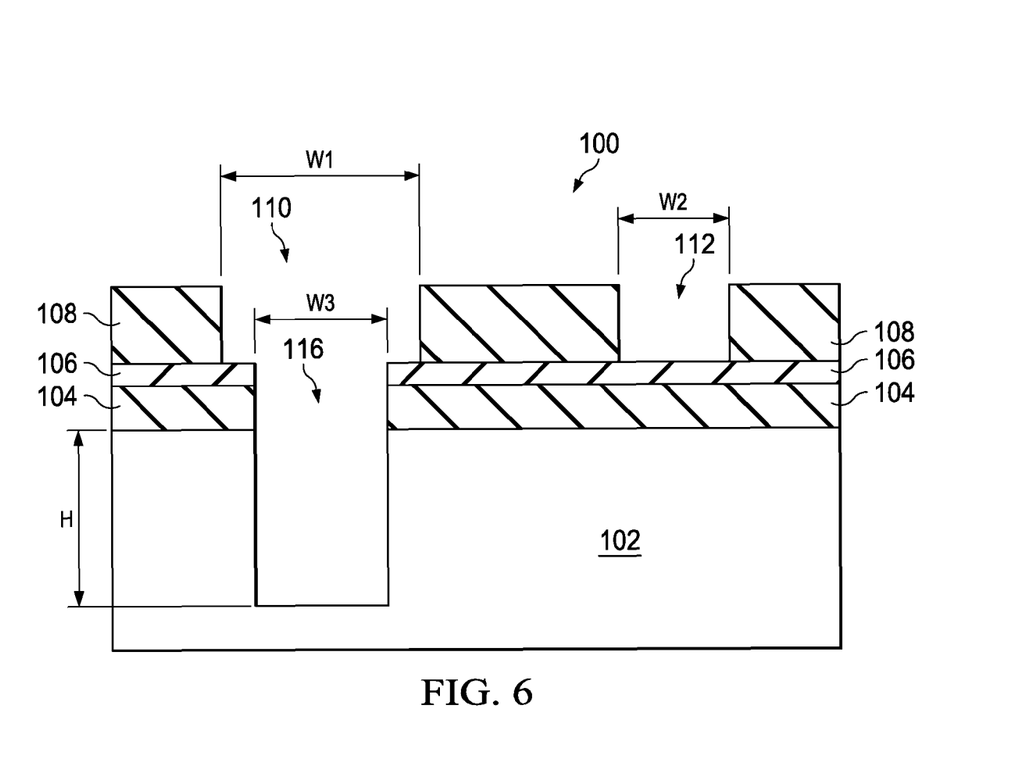

In the resulting structure illustrated in FIG. 6, pad opening 110 may have horizontal dimension W1 greater than horizontal dimension W3 of TSV opening 116. Furthermore, TSV opening 116 may have an aspect ratio (i.e., vertical dimension H over horizontal dimension W3) greater than about 4. In various embodiments, vertical dimension H may be greater than about 50 µm, or in some embodiments greater than about 100 µm.

Figure 7A:
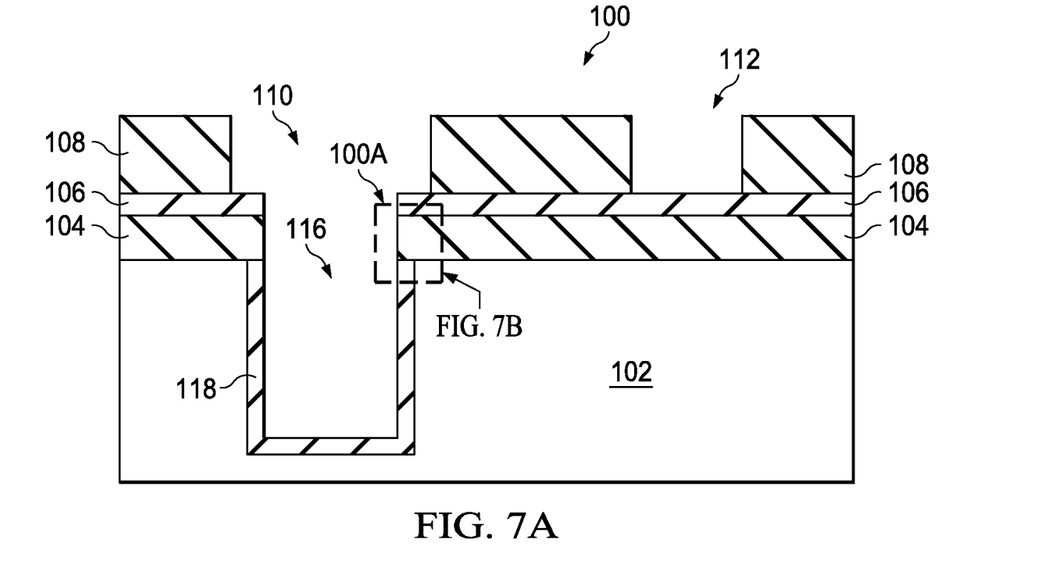

FIG. 7A illustrates the formation of an isolation layer 118 on sidewalls and a bottom surface of TSV opening 116. Isolation layer 118 may be formed on the surfaces of substrate 102, which surfaces are exposed to TSV opening 116. Isolation layer 118 may be formed using thermal oxidation (e.g., at a temperature of about 900° Celsius although other temperatures may be used) of the exposed surfaces of substrate 102. Because of the thermal oxidation process used, isolation layer 118 may also be referred to as oxide liner 118. In contrast to other deposition methods, thermal oxidation may advantageously form isolation layer 118 selectively on substrate 102 without forming isolation layer 118 on dielectric layer 108 (i.e., in pad opening 110 or trench 112). Thus, isolation layer 118 may be formed without the risk of pinching off (i.e., sealing) trench 112 or forming an additional interface material in pad opening 110 and trench 112.

Figure 7B:
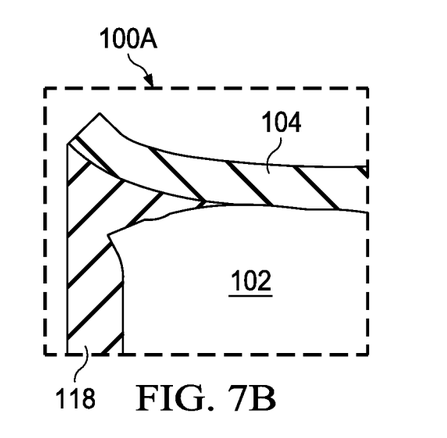

FIG. 7B illustrates a more detailed view of a portion of wafer 100 (i.e., portion 100A) after the formation of isolation layer 118. Due to the thermal oxidation process used to form isolation layer 118, isolation layer 118 may extend partially between substrate 102 and isolation layer 104 (or whatever semiconductor device layer directly over and contacting substrate 102). For example, isolation layer 118 may form a bird-beak shape between substrate 102 and isolation layer 104. Isolation layer 118 may cause a small separation between substrate 102 and isolation layer 104 and may further cause corner portions of substrate 102 and isolation layer 104 adjacent isolation layer 118 to be a curved and non-planar. In various embodiments, only corner regions of substrate 102 and isolation layer 104 adjacent TSV opening 116 may be affected by the thermal oxidation process. Other portions of substrate 102 and isolation layer 104 may remain unaffected and be substantially planar. In alternative embodiments, other deposition processes may be used for isolation layer 118

Figure 8:
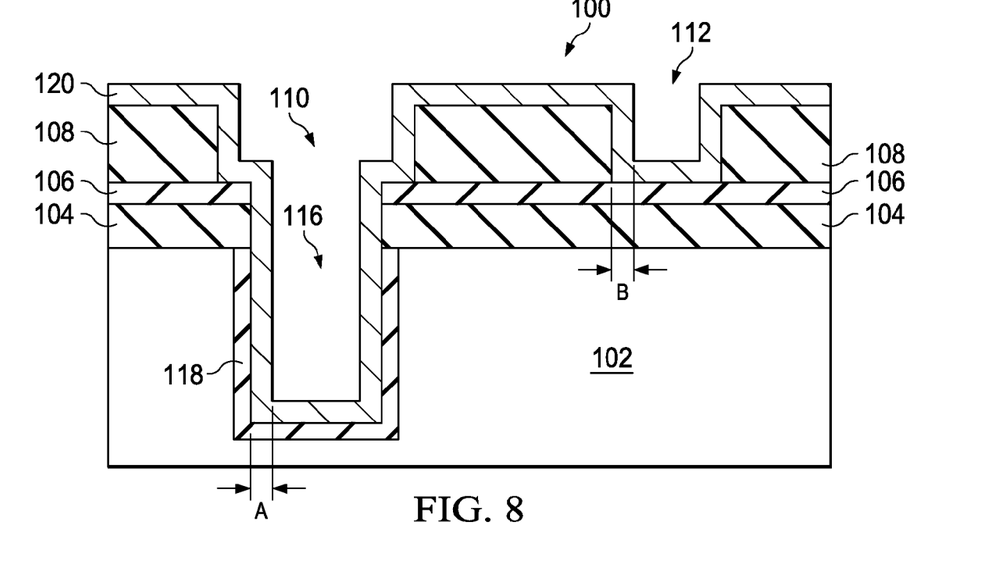

FIG. 8 illustrates the formation of a highly conformal barrier layer 120 in wafer 100. In an embodiment, barrier layer 120 is formed of titanium, titanium nitride, tantalum, tantalum nitride, combinations thereof, or the like. Barrier layer 120 may be formed to cover sidewalls and bottom surfaces of both TSV opening 116, pad opening 110, and trench 112. In some embodiments, barrier layer 120 may be between about 8 nm and about 15 nm thick. The applicable formation method of barrier layer 120 may include a highly conformal deposition process such as a wet deposition process using a wet bench tool.

Figure 16A:
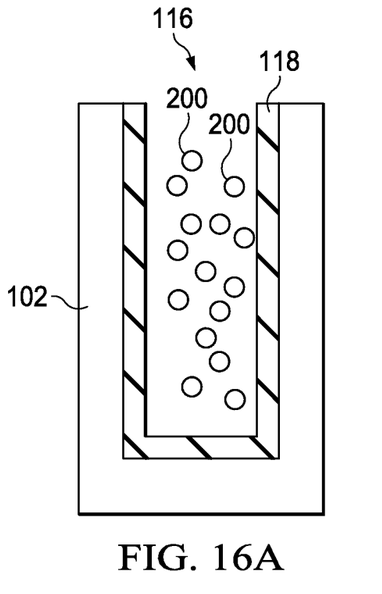
FIGS. 16A through 16D illustrate cross-sectional views of forming a barrier layer using a wet deposition process in accordance with various embodiments.
Figure 16B:
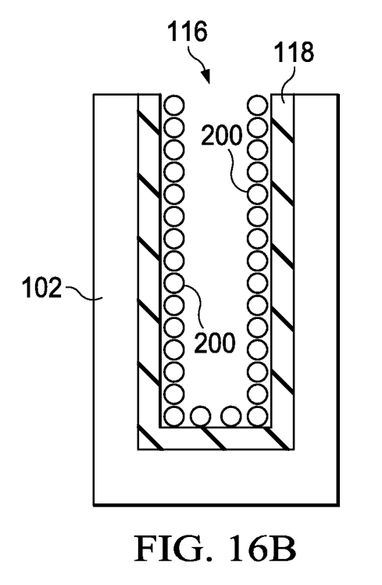

For example, FIGS. 16A through 16D illustrate intermediate stages of forming barrier layer 120 in substrate 100 accordance using a wet deposition process. As illustrated by FIG. 16A, wafer 100 may be submerged in a suitable pre-cursor chemical solution, for example, having a well-suspended catalyst 200. Catalyst 200 may be a material selected to have good absorption/adhesion properties to sidewalls of substrate 102/dielectric layer 108. The good absorption/adhesive properties may allow catalyst 200 to be deposited along sidewalls of TSV opening 116 as illustrated by FIG. 16B. For example, after submersion in the pre-cursor chemical solution, sidewalls of TSV opening 116 may be activated and covered by catalyst 200. A drying may then be performed to partially dry wafer 100.

Figure 16C:
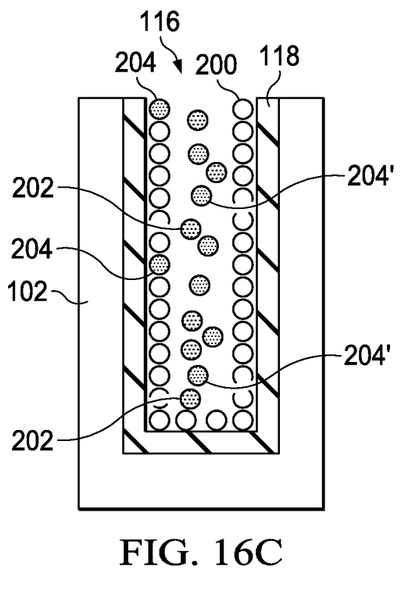
Figure 16D:
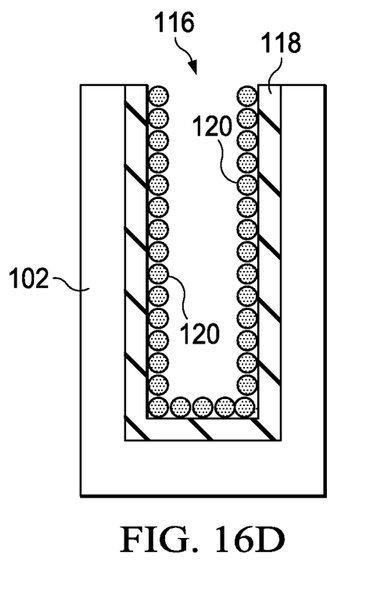

Next, as illustrated by FIG. 16C, a chemical plating process may be used form diffusion barred layer 120. The chemical plating process may include depositing a reduction agent 202 and ions 204 in TSV opening 116. Ions 204 may be charged ions (e.g., having a positive charge) of a material used for diffusion barrier layer 120 (e.g., titanium nitride, titanium oxide, tantalum nitride, tantalum oxide, and the like). Reduction agent 202 may be any element which chemically reacts with catalyst 200 to form electrons near sidewalls of TSV opening 116. For example, through a chemical reaction between catalyst 200 and reduction agent 202, electrons may be formed near sidewalls of TSV opening 116. When the electrons interact with ions 204 (e.g., a positively charged material), material 204' (e.g., titanium nitride, titanium oxide, tantalum nitride, tantalum oxide, and the like) of diffusion barrier layer 120 may be formed on sidewalls of TSV opening 116. Thus, as illustrated in FIG. 16D, diffusion barrier layer 120 may be selectively formed through electron transferred from reduction agent 202 and ions 204 on activated surfaces of TSV opening 115. Although only substrate 102 is illustrated in FIGS. 16A through 16D, a similar process may be applied simultaneously to dielectric layer 108.

Referring back to FIG. 8, the wet deposition process allows for improved coverage (e.g., substantially close to 100% step coverage) on exposed surfaces of TSV opening 116, pad opening 110, and trench 112 compared to conventional non-conformal deposition methods (e.g., physical vapor deposition (PVD)). In various embodiments, a seed layer (e.g., copper or copper alloy, not shown) may also be formed using a similar or different conformal deposition process over barrier layer 120 in TSV opening 116, pad opening 110, and trench 112.

As a result of the highly conformal deposition process, a thickness A of barrier layer 120 in TSV opening 116 may be substantially equal to a thickness B of barrier layer 120 in trench 112. For example, on average, thickness A may only differ from thickness B by about 1% to about 5%. Thicknesses A and B may not be completely uniform. For example, barrier layer 120 on a sidewall of TSV opening 116 may have a maximum thickness A' and a minimum thickness A". Barrier layer 120 on a sidewall of trench 112 may have a maximum thickness B' and a minimum thickness B". In various embodiments, barrier layer 120 is sufficiently conformal so that a ratio of maximum thicknesses A' to B' and a ratio of minimum thicknesses A" to B" is between about 0.8 and about 1.2.

In non-conformal deposition methods, thickness B may be significantly greater than thickness A due to the larger dimension of TSV opening 116. For example, a longer deposition time may be required to sufficiently cover the larger surface area of TSV opening 116, which may lead to barrier layer 120 having a large overhang on sidewalls of trench 112. In some cases, particularly in fine pitch devices (e.g., when horizontal dimension W2 is less than 0.6 µm) the large overhang can pinch off (i.e., seal) trench 112, preventing the filling of trench 112 with a metallic material in subsequent process steps. The conformal deposition process described above reduces such variations in barrier layer 120. Thus, even in finely pitched applications, a single barrier layer may be formed for both TSV opening 116 and trench 112 without forming an unacceptably large barrier layer 120 that risks pinching off trench 112.

Figure 9:
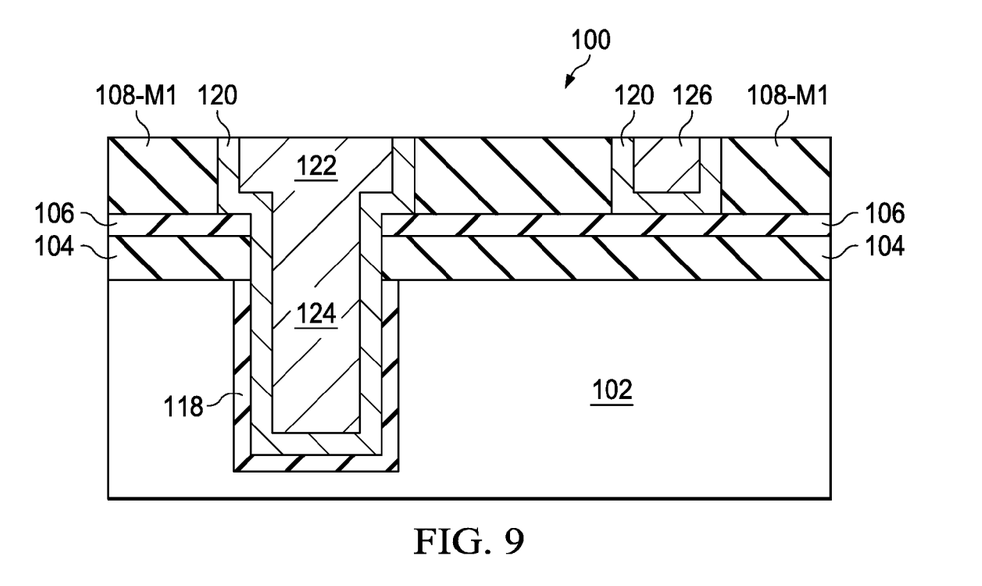

A metallic material is then filled into openings 110, 112, and 116, for example using electro-chemical plating (ECP). The metallic material may be copper, copper alloys, or the like. In embodiments where a seed layer was deposited, the metallic material may be formed of similar materials, and hence the seed layer may appear to be merged with metallic material. Alternatively, in embodiments where the seed layer is omitted, the metallic material may be filled into openings 110, 112, and 116 using a seedless electroplating process. After deposition, the top surface of the metallic material may be higher than the top surface of dielectric layer 108. A planarization, such as a chemical mechanical polish (CMP), may be performed to remove excess portions of the metallic material, which portions are above the top surface of dielectric layer 108. As a result, metal pad 122, metal line 126, and TSV 124 are formed as illustrated in FIG. 9.

Throughout the description, metal pad 122 and metal line 126 are referred to as being located in metal layer M1, which is the first metal layer immediately over substrate 102. In subsequent steps, additional metal layer(s) and vias (not shown) may be formed over metal layer M1, and may be electrically coupled to metal pad 122, metal line 126, and TSV 124. Solder bumps (not shown) may also be formed over M1 and the additional metal layers, if any, to electrically couple to metal pad 122, metal line 126, and TSV 124

Figure 10A:
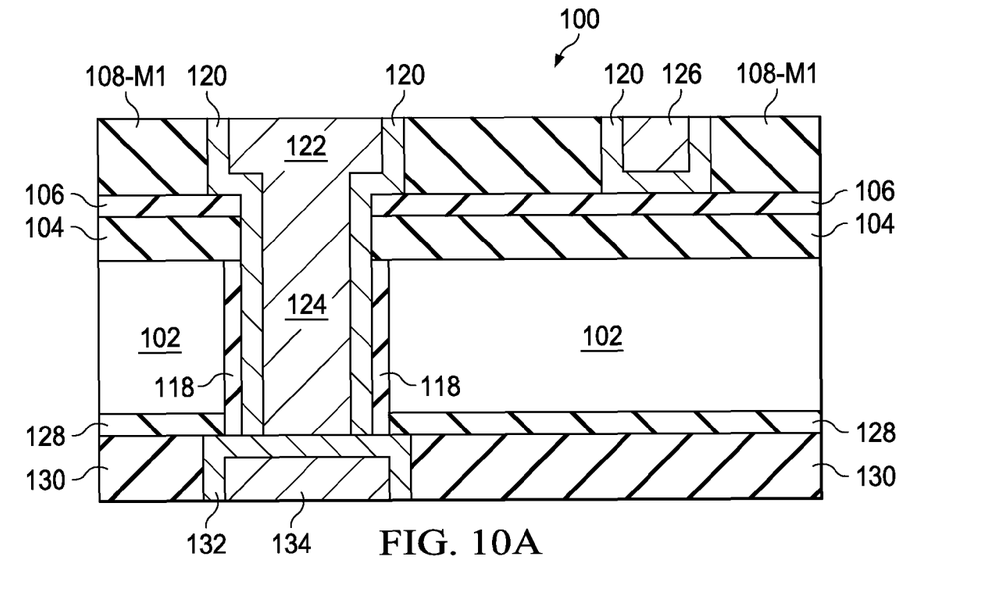

Next, as shown in FIG. 10A, backside interconnect structures are formed on a backside of substrate 102 using any suitable method. The formation of the backside interconnect structures may include exposing TSV 124 (e.g., through grinding and/or recessing substrate 102 so that a portion of TSV 124 extends past substrate 102). The backside interconnect structures may include an isolation layer 128 and a dielectric layer 130. Isolation layer 128 may be formed of silicon oxide, silicon nitride, or the like and may be substantially similar to isolation layer 104. Dielectric layer 130 may be substantially similar to dielectric layer 108. In an embodiment, a metal pad 134 is formed in dielectric layer 130 and electrically connected to TSV 124. TSV 124 and metal pad 134 may be spaced apart from each other by a diffusion barrier layer 132 (e.g., comprising titanium, titanium nitride, tantalum, tantalum nitride, and the like), which may be formed of a material different from the material of TSV 124 and metal pad 134. Although FIG. 10A only illustrates one dielectric layer 130, alternative embodiments may include multiple dielectric layers having multiple interconnect structures (e.g., metal lines and/or vias) formed therein. In yet other embodiments, dielectric layer 130 may be omitted and an under-bump metallurgy (UBM, not shown) may be formed on the backside of substrate 102. The UMB may be electrically connected to TSV 124, and a connector (e.g., a controlled collapse chip connector, not shown) may be formed on the UMB. Other alternative configurations for backside interconnect structures may also be used.

Figure 10B:
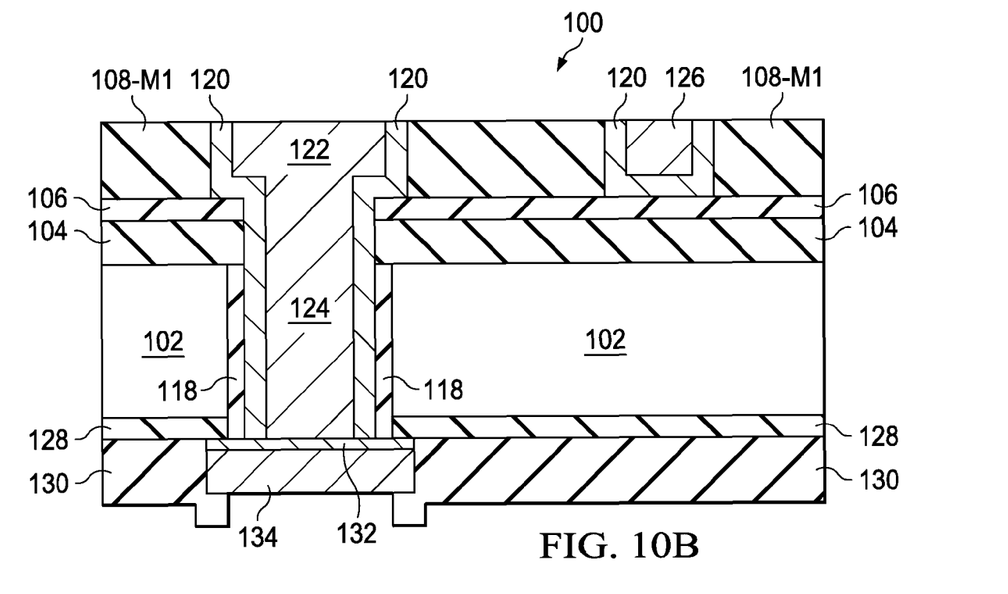

For example, FIG. 10B illustrates a backside interconnect structures formed on a backside of substrate 102 in accordance with alternative embodiments. The formation of the backside interconnect structures of FIG. 10B may include exposing TSV 124 (e.g., through grinding and/or recessing substrate 102 so that a portion of TSV 124 extends past substrate 102). Isolation layer 128 may then be formed on the exposed backside of substrate 102. Isolation layer 128 may be formed of silicon oxide, silicon nitride, or the like and may be substantially similar to isolation layer 104. An UBM 132 may be formed on exposed surfaces of TSV 124 using any suitable method such as physical vapor deposition, or the like. Metal pad 134 (e.g., comprising copper, or the like) may be formed on UBM 132, and metal pad 134 may be electrically connected to TSV 124. For example, the formation of metal pad 134 may include depositing a photoresist (not shown) on UBM 132 and the backside of substrate 102. The photoresist may be patterned to define an opening for metal pad 134, and metal pad 134 may be formed in the opening, for example, using an ECP process. The photoresist may then be removed. Dielectric layer 130 may then be formed and patterned on substrate 102 and exposing contact 134. In this embodiment, metal pad 134 may be spaced apart from TSV 124 by UBM 132, and metal pad 134 may be substantially free of a diffusion barrier layer.

In the structure as shown in FIGS. 10A and 10B, it is observed that metal pad 122 and TSV 124 do not have a diffusion barrier layer therebetween. Instead, the respective diffusion barrier layer 120 continuously extends from the top surface of dielectric layer 108 into substrate 102. In other words, metal pad 122 and TSV 124 may be formed of a same material, which continuously extends from the top surface of dielectric layer 108 to the bottom surface of substrate 102, with no diffusion barrier layer (which is formed of a material different from that of metal pad 122 and TSV 124) between and separating metal pad 122 and TSV 124. Diffusion barrier layer 120 may be a highly conformal layer which has substantially a same thickness on sidewalls of TSV 124 as on sidewalls of metal line 126.

An isolation layer 118 may be formed on sidewalls of TSV 124 in substrate 102. The isolation layer 118 may be formed using a thermal oxidation process, which may cause isolation layer 118 to extend slightly between substrate 102 and isolation layer 104. The formation of isolation layer 118 may further cause corners of substrate 102 and isolation layer 104 adjacent isolation layer 118/TSV 124 to be non-planar (i.e., curved).

In the embodiments wherein active devices (not shown) are formed in wafer 100, the resulting chip/die sawed from wafer 100 may be a device die. Alternatively, the embodiments wherein no active devices (not shown) are formed in wafer 100, and the resulting chip/die sawed from wafer 100 may be an interposer die or a package substrate.

Furthermore, in above-discussed embodiments, TSV opening 116 is formed after the formation of pad opening 110 and trench 112 in a TSV last approach. In alternative embodiments, TSV opening 116 may be formed before the formation of pad opening 110 and trench 112 in a TSV first approach as illustrated in FIGS. 11 through 15B. Unless specified otherwise, the reference numerals in these embodiments represent like elements as in the embodiments illustrated in FIGS. 1 through 10B. The materials and the formation details of these elements hence may not be repeated herein.

Figure 11:
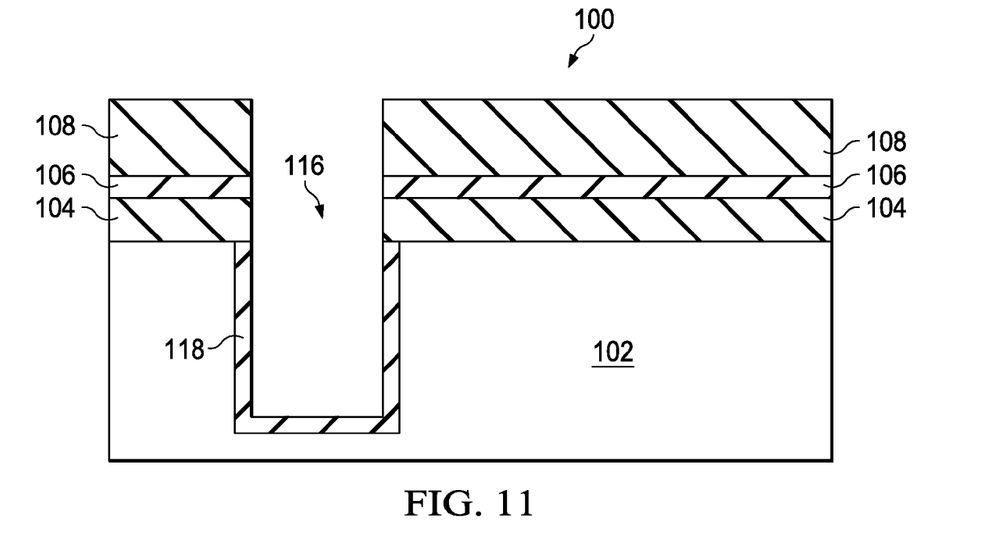

FIG. 11 illustrates the formation of TSV opening 116 by etching into dielectric layer 108, ESL 106, isolation layer 104, and into substrate 102. The formation of TSV opening 116 may be achieved, for example, using a combination of photolithography and etching. Notably, TSV opening 116 is formed prior to the formation of pad opening 110 and/or trench 112. Isolation layer 118 may be formed on the surfaces of substrate 102, which surfaces are exposed to TSV opening 116. Isolation layer 118 may be formed using thermal oxidation (in which case isolation layer 118 may comprise silicon oxide), although a deposition method such as plasma enhanced chemical vapor deposition (PECVD) may also be used.

Figure 12:
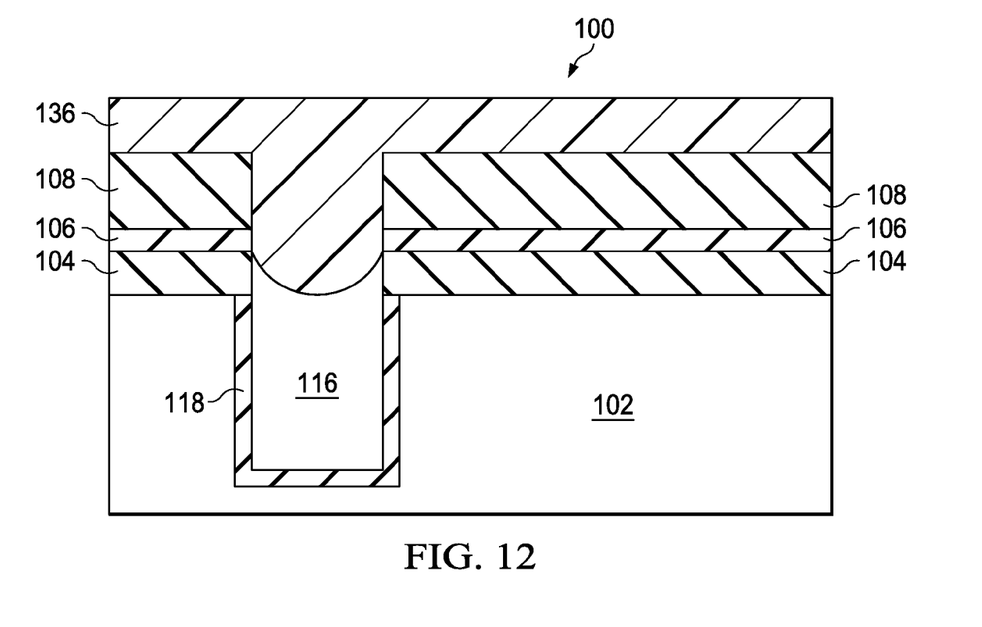
Figure 13:
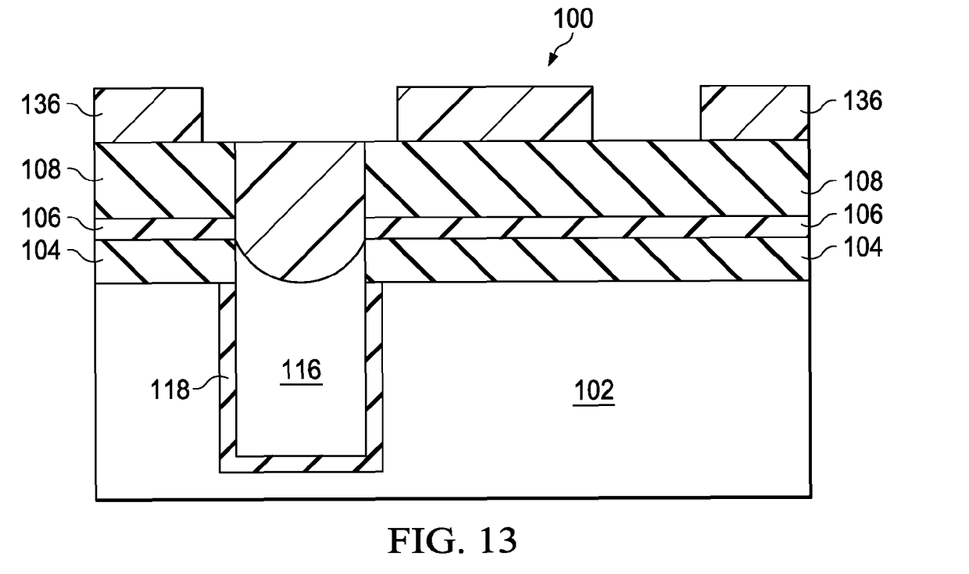

FIGS. 12 and 13 illustrate the application and the patterning of photo resist 136. After forming oxide liner 18 in the TSV opening 116 as shown in FIG. 11, photoresist 136 is applied as depicted in FIG. 12. Photoresist 136 may flow into TSV opening 116. In FIG. 13, photoresist 136 is exposed to light and developed, with the portion of photoresist 136 directly over TSV opening 116 being removed. Additional portions of photoresist 136 may be removed in order to form one or more trenches in dielectric layer 108. It is observed that the lower portion of photoresist 136 in TSV opening 116 may not be exposed to light adequately, and hence is not removed during the development of photoresist 136.

Figure 14:
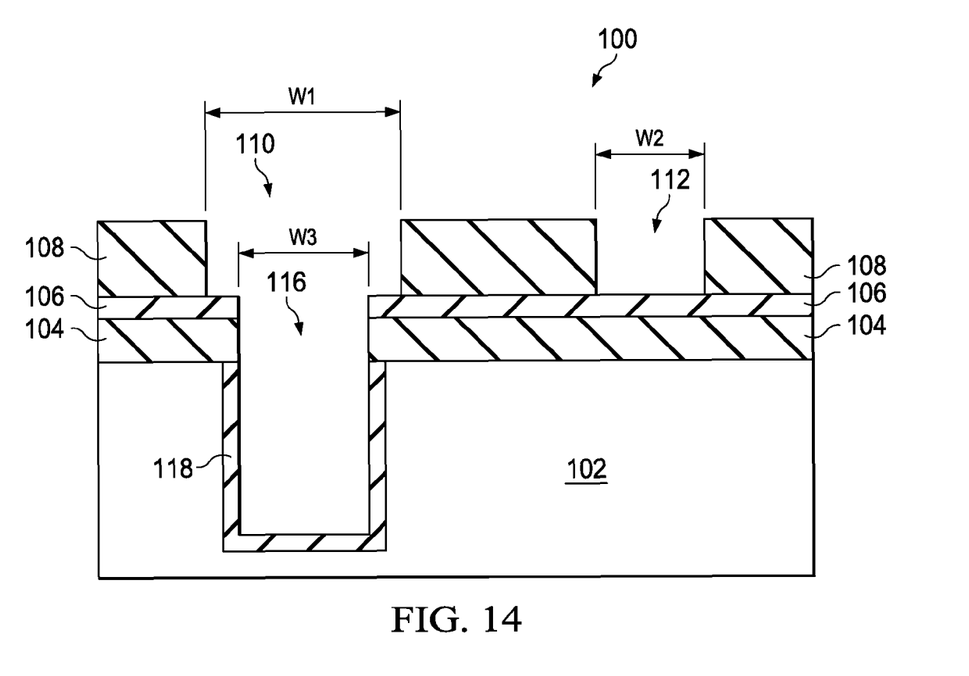

Next, as shown in FIG. 14, photoresist 136 is used as a mask to etch dielectric layer 108. As a result of the etching step, pad opening 110 and trench 112 are formed in dielectric layer 108. Photoresist 136 is then removed, for example, through an ashing process. The portion of photoresist 136 in TSV opening 116 is also removed. In the resulting structure, pad opening 110 may have horizontal dimension W1 (which may be a diameter or a length/width, depending on the top-view shape of pad opening 110) greater than horizontal dimension W3 of TSV opening 116. The remaining processes are essentially the same as shown in FIGS. 8 through 11, and hence are not discussed in detail herein.

Figure 15A:
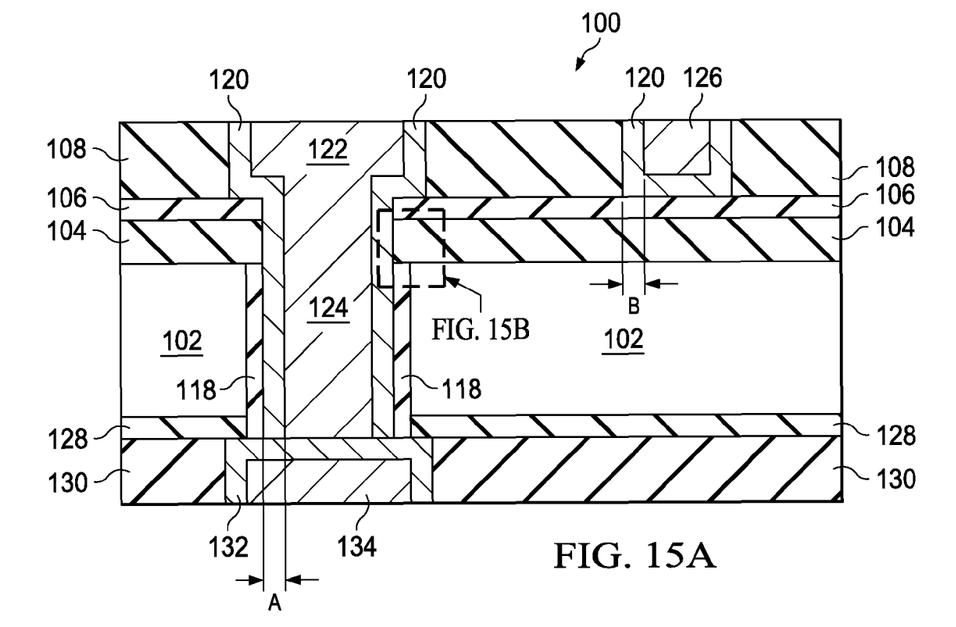
Figure 15B:
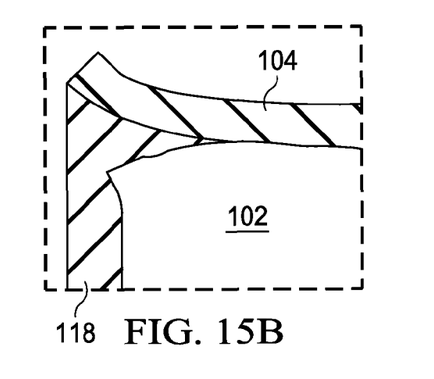

FIGS. 15A and 15B illustrate a resulting structure after the like process steps as shown in FIGS. 8 through 10A/10B are performed, which structure includes metal pad 122, TSV 124, metal line 126, and a backside interconnect structure. Similar to the embodiment as shown in FIG. 10A/10B, metal pad 122 and TSV 124 do not have a diffusion barrier layer therebetween, while one diffusion barrier layer 120 continuously extends from the top surface of dielectric layer 108 to surface 10b of substrate 102. Diffusion barrier layer 120 is formed using a substantially conformal deposition process. In various embodiments, thickness A of barrier layer 120 on a sidewall of TSV 124 is substantially equal (e.g., on average within 1% to 5%) to thickness B of barrier layer 120 on a sidewall of metal line 126. Barrier layer 120 is sufficiently conformal so that a ratio of maximum thicknesses A' to B' and a ratio of minimum thicknesses A'' to B'' is between about 0.8 and about 1.2. Furthermore, when a thermal oxidation process is used to form isolation layer 118, a portion of isolation layer 118 may extend between isolation 104 and substrate 102 (as illustrated by FIG. 15B). As a result, portions of isolation layer 104 and substrate 102 may be separated from each other and have a curved, non-planar shape.

In accordance with embodiments, a method includes forming a dielectric layer over a substrate, forming a first opening in the dielectric layer, and forming a second opening in the substrate. The first and the second openings are aligned and have different horizontal dimensions. The method further includes forming an isolation layer on sidewalls of the second opening using a thermal oxidation process. A metallic material is filled into the first and the second openings, and a planarization is performed on the metallic material to remove excess portions of the metallic material above a top surface of the dielectric layer. Remaining portions of the metallic material form a metal pad in the first opening and a through-substrate via (TSV) in the second opening.

In accordance with other embodiments, a method includes forming an isolation layer over a substrate and forming a dielectric layer over the isolation layer. The method further includes patterning a first opening in the dielectric layer and etching the substrate to expand the first opening in the dielectric layer into a second opening in the substrate. The second opening has a second horizontal dimension less than a first horizontal dimension of the first opening. A thermal oxidation is performed on sidewalls of the second opening to form an isolation layer. A metallic material is filled into the first and the second openings. The metallic material is filled over the first diffusion barrier layer. A planarization is performed on the metallic material to remove excess portions of the metallic material above a top surface of the dielectric layer to form a metal pad in the first opening and a through-substrate via (TSV) in the second opening.

In accordance with yet other embodiments, a device includes a substrate having a front side and a backside, the backside being opposite the front side. An isolation layer is disposed on the front side of the substrate, wherein a first portion of isolation layer and the substrate are in physical contact. A through substrate via (TSV) extends from the front side to the backside of the substrate. An oxide liner is on a sidewall of the TSV. The oxide liner extends between a second portion of the isolation layer and the substrate. A dielectric layer having a metal pad is disposed over the isolation layer on the front side of the substrate. The metal pad and the TSV are formed of a same material.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a dielectric layer over a substrate;
    forming a first opening in the dielectric layer;
    prior to forming the first opening, forming a second opening in the substrate, wherein the first and the second openings are aligned and have different horizontal dimensions;
    also prior to forming the first opening, forming a first isolation layer on sidewalls of the second opening using a thermal oxidation process;
    filling a metallic material into the first and the second openings; and
    performing a planarization on the metallic material to remove excess portions of the metallic material above a top surface of the dielectric layer, wherein remaining portions of the metallic material form a metal pad in the first opening and a through-substrate via (TSV) in the second opening.

2. The method of claim 1, further comprising:
    forming a trench in the dielectric layer;
    after forming the first isolation layer, depositing a diffusion barrier layer on sidewalls of the second opening and the trench; and filling the metallic material in the trench, wherein after performing the planarization, the remaining portions of the metallic material form a metal line in the trench.

3. The method of claim 2, wherein depositing the diffusion barrier layer comprises a wet deposition process.

4. The method of claim 2, wherein the diffusion barrier layer comprises titanium oxide, titanium nitride, tantalum nitride, tantalum oxide, or a combination thereof.

5. The method of claim 1, wherein the first opening is formed before forming the second opening.

6. The method of claim 5, wherein forming the second opening comprises:
  forming a photoresist over the dielectric layer and in the first opening;
  patterning the photoresist to form a third opening in the photoresist, wherein the third opening is aligned with the first opening; and
  etching the substrate using the photoresist as a mask to form the second opening.

7. The method of claim 1 further comprising, before forming the dielectric layer, forming a second isolation layer over and contacting a top surface of the substrate.

8. The method of claim 1 further comprising, after performing the planarization, forming a backside interconnect structure electrically connected to the TSV.

9. The method of claim 1, wherein the thermal oxidation process is performed at a temperature of about 900° Celsius.

10. A method comprising:
  forming an isolation layer over a substrate;
  forming a dielectric layer over the isolation layer;
  patterning a first opening in the dielectric layer;
  forming a patterned photoresist disposed at least partially in the first opening, wherein the patterned photoresist exposes an etch stop layer formed on the isolation layer without exposing the substrate;
  etching the isolation layer and the substrate using the patterned photoresist as a mask, wherein etching the isolation layer and the substrate expands the first opening in the dielectric layer into a second opening in the substrate, and wherein the second opening has a second horizontal dimension less than a first horizontal dimension of the first opening;
  performing a thermal oxidation to form an oxide liner in the second opening;
  filling a metallic material into the first and the second openings; and
    performing a planarization on the metallic material to remove excess portions of the metallic material above a top surface of the dielectric layer to form a metal pad in the first opening and a through-substrate via (TSV) in the second opening.

11. The method of claim 10 further comprising:
patterning a trench in the dielectric layer;
after performing the thermal oxidation, forming a diffusion barrier layer on sidewalls of the first and the second openings and the trench, wherein forming the diffusion barrier layer comprises a wet deposition process;
filling the metallic material into the trench, wherein after performing the planarization, a metal line is formed in the trench.

12. The method of claim 11, wherein the wet deposition process comprises submerging the sidewalls of the first and the second openings and the trench in a precursor solution and chemically plating the sidewalls of the first and the second openings and the trench with the diffusion barrier layer.

13. The method of claim 10, wherein performing the thermal oxidation comprises forming the oxide liner to extend at least partial between the isolation layer and the substrate.

14. The method of claim 10 further comprising forming a backside interconnect structure electrically connected to the TSV.

15. A method comprising:
  forming an isolation layer over a semiconductor substrate;
  forming a dielectric layer over the isolation layer;
  patterning a first opening and a trench in the dielectric layer;
  forming a patterned photoresist disposed at least partially in the first opening, wherein the patterned photoresist exposes an etch stop layer formed on the isolation layer without exposing the substrate;
  patterning a second opening in the semiconductor substrate and the isolation layer using the patterned photoresist as an etching mask, wherein the second opening is connected to the first opening, and wherein the first opening and the second opening comprise different horizontal dimensions;
  forming an oxide liner in the second opening using a thermal oxidation process;
  forming a diffusion barrier layer on sidewalls of the first opening, the second opening, and the trench; and
  filling the first opening, the second opening, and the trench with a metallic material.

16. The method of claim 15, wherein forming the diffusion barrier layer comprises a wet deposition process.

17. The method of claim 16, wherein the wet deposition process comprises:
  submerging sidewalls of the first opening, the second openings, and the trench in a precursor solution; and
  chemically plating the sidewalls of the first opening, the second opening, and the trench with the diffusion barrier layer.

18. The method of claim 15, further comprising performing a planarization on the metallic material to remove excess portions of the metallic material over a top surface of the dielectric layer to form a metal pad in the first opening, a metal line in the trench, and a through-substrate via (TSV) in the second opening.

19. The method of claim 15 further comprising forming the etch stop layer between the isolation layer and the dielectric layer.

20. The method of claim 15, wherein forming the oxide liner comprises forming a portion of the oxide liner between the substrate and the isolation layer.

* * * * *